United States Patent
Oh

[11] Patent Number: 5,889,664
[45] Date of Patent: Mar. 30, 1999

[54] MULTIPLE LEVEL VOLTAGE GENERATOR FOR SEMICONDUCTOR MEMORY DEVICE

[75] Inventor: Young Nam Oh, Ichon-shi, Rep. of Korea

[73] Assignee: Hyundai Electronics Industries Co., Ltd., Ichon-Shi, Rep. of Korea

[21] Appl. No.: 914,878

[22] Filed: Aug. 20, 1997

[30] Foreign Application Priority Data

Aug. 21, 1996 [KR] Rep. of Korea ............... 1996 34616

[51] Int. Cl.[6] .................................................. H02M 7/25
[52] U.S. Cl. .............................................. 363/60; 327/536
[58] Field of Search ...................... 363/59, 60; 327/536

[56] References Cited

U.S. PATENT DOCUMENTS

| | | | |
|---|---|---|---|
| 4,403,158 | 9/1983 | Slemmer | 327/536 |
| 5,267,201 | 11/1993 | Foss et al. | 327/536 |
| 5,280,420 | 1/1994 | Rapp | 363/60 |
| 5,589,793 | 12/1996 | Kassapian | 327/536 |
| 5,703,827 | 12/1997 | Leung et al. | 327/536 |
| 5,796,600 | 8/1998 | Yun | 363/59 |
| 5,818,766 | 10/1998 | Song | 327/536 |

Primary Examiner—Jeffrey Sterrett
Attorney, Agent, or Firm—Thelen Reid & Priest LLP

[57] ABSTRACT

A multiple level voltage generator for a semiconductor memory device, comprising a back bias voltage charge pumping circuit for pumping charge to a back bias voltage node, a back bias voltage level detector for detecting the level of a back bias voltage at the back bias voltage node and generating first and second back bias voltage detection signals in accordance with the detected result, a high voltage charge pumping circuit for pumping charge to a high voltage node, a high voltage level detector for detecting the level of a high voltage at the high voltage node and generating first and second high voltage detection signals in accordance with the detected result, a control logic circuit for generating a control signal in response to the second back bias voltage detection signal from the back bias voltage level detector and the second high voltage detection signal from the high voltage level detector, and an oscillator for generating first and second output signals in response to the control signal from the control logic circuit, the first back bias voltage detection signal from the back bias voltage level detector and the first high voltage detection signal from the high voltage level detector and applying the generated first and second output signals to the back bias voltage charge pumping circuit and the high voltage charge pumping circuit, respectively.

8 Claims, 6 Drawing Sheets

MULTIPLE LEVEL VOLTAGE GENERATOR FOR SEMICONDUCTOR MEMORY DEVICE

BACKGROUND OF THE INVENTION

1. Field of the Invention

The present invention relates in general to a multiple level voltage generator for a semiconductor memory device, and more particularly to a multiple level voltage generator in which a single ring oscillator is used instead of a plurality of ring oscillators to drive a plurality of charge pumping circuits, so that power consumption can be reduced.

2. Description of the Prior Art

Generally, a back bias voltage generator and a high voltage generator are adapted to generate a low back bias voltage and a bootstrapped high voltage, respectively, which are used in a semiconductor memory device. The back bias voltage is applied to a well or a substrate to maintain a junction between the well or substrate and a general circuit at a reverse bias state, so as to separate them from each other. The bootstrapped high voltage is used to increase the current drive capability of an NMOS transistor and prevent an output voltage loss.

In a conventional multiple level voltage generator for a semiconductor memory device, a plurality of oscillators are provided to generate pulses to drive a plurality of charge pumping circuits. As the oscillators are increased in number, current consumption is increased, too. In particular, oscillators for the generation of back bias and high voltages are very large in current consumption.

SUMMARY OF THE INVENTION

Therefore, the present invention has been made in view of the above problem, and it is an object of the present invention to provide a multiple level voltage generator for a semiconductor memory device which is capable of minimizing an operating current amount and is adaptable to a function mode variation.

In accordance with the present invention, the above and other objects can be accomplished by a provision of a multiple level voltage generator for a semiconductor memory device, comprising back bias voltage charge pumping means for pumping charge to a back bias voltage node; back bias voltage level detection means for detecting the level of a back bias voltage at the back bias voltage node and generating first and second back bias voltage detection signals in accordance with the detected result, the first and second back bias voltage detection signals being the same in amplitude and opposite in phase; high voltage charge pumping means for pumping charge to a high voltage node; high voltage level detection means for detecting the level of a high voltage at the high voltage node and generating first and second high voltage detection signals in accordance with the detected result, the first and second high voltage detection signals being the same in amplitude and opposite in phase; control means for generating a control signal in response to the second back bias voltage detection signal from the back bias voltage level detection means and the second high voltage detection signal from the high voltage level detection means; and oscillation means for generating first and second output signals in response to the control signal from the control means, the first back bias voltage detection signal from the back bias voltage level detection means and the first high voltage detection signal from the high voltage level detection means and applying the generated first and second output signals to the back bias voltage charge pumping means and the high voltage charge pumping means, respectively.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
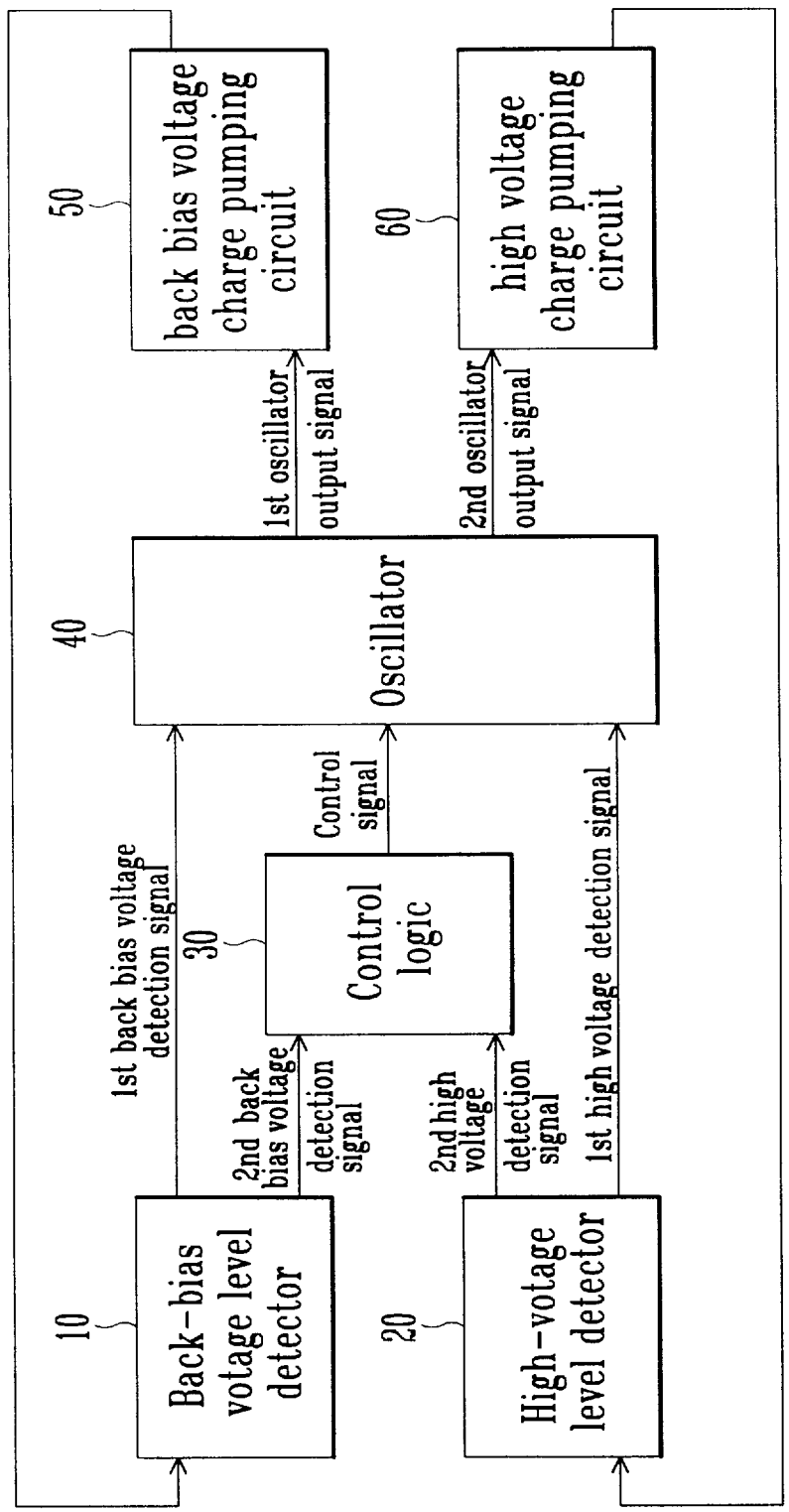
FIG. 1 is a block diagram illustrating the construction of a multiple level voltage generator for a semiconductor memory device in accordance with the present invention.

FIG. 1 is a block diagram illustrating the construction of a multiple level voltage generator for a semiconductor memory device in accordance with the present invention. As shown in this drawing, the multiple level voltage generator comprises a back bias voltage charge pumping circuit 50 for pumping charge to a back bias voltage node in response to a first output signal from an oscillator 40, a back bias voltage level detector 10 for detecting the level of a back bias voltage at the back bias voltage node and generating first and second back bias voltage detection signals in accordance with the detected result, a high voltage charge pumping circuit 60 for pumping charge to a high voltage node in response to a second output signal from the oscillator 40, and a high voltage level detector 20 for detecting the level of a high voltage at the high voltage node and generating first and second high voltage detection signals in accordance with the detected result. The oscillator 40 is adapted to generate the first and second output signals in response to a control signal from a control logic circuit 30, the first back bias voltage detection signal from the back bias voltage level detector 10 and the first high voltage detection signal from the high voltage level detector 20. The control logic circuit 30 is adapted to generate the control signal in response to the second back bias voltage detection signal from the back bias voltage level detector 10 and the second high voltage detection signal from the high voltage level detector 20.

Figure 2:
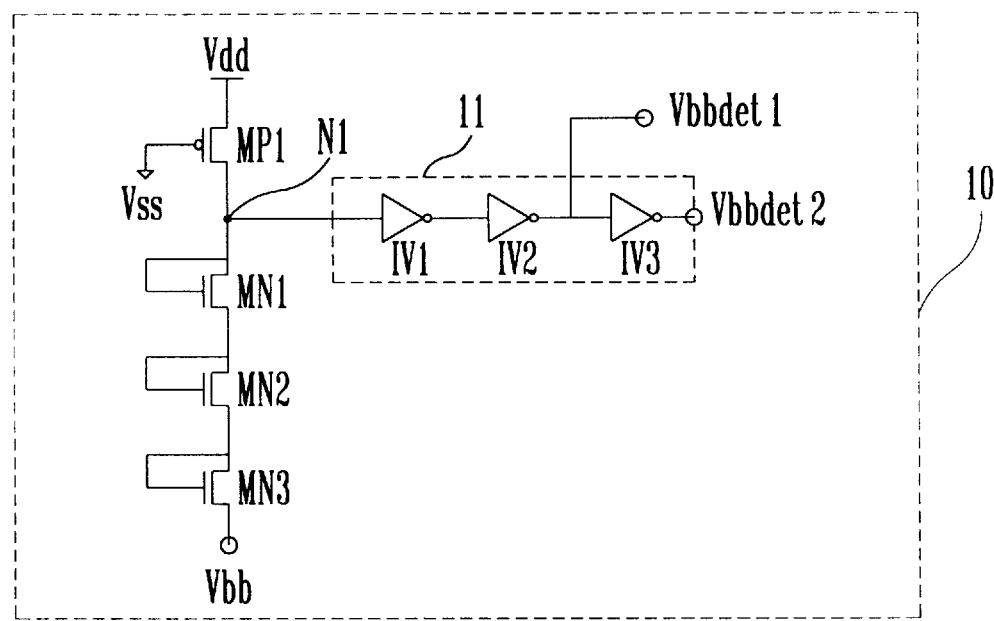
FIG. 2 is a detailed circuit diagram of a back bias voltage level detector in FIG. 1.

FIG. 2 is a detailed circuit diagram of the back bias voltage level detector 10 in FIG. 1. As shown in this drawing, the back bias voltage level detector 10 includes a first PMOS transistor MP1 connected between a supply voltage Vdd and a first node N1, and first to third NMOS transistors MN1–MN3 connected in the form of diodes in series between the first node N1 and the back bias voltage node. The first PMOS transistor MP1 has its gate connected to a ground voltage Vss. The back bias voltage level detector 10 further includes a first buffer 11 connected to the first node N1. The first buffer 11 is provided with first and second inverters IV1 and IV2 connected in series between the first node N1 and an output terminal of the first buffer 11 for outputting the first back bias voltage detection signal Vbbdet1, and a third inverter IV3 connected between the output terminal of the first buffer 11 for outputting the first back bias voltage detection signal Vbbdet1 and an output terminal of the first buffer 11 for outputting the second back bias voltage detection signal Vbbdet2.

The operation of the back bias voltage level detector 10 with the above-mentioned construction in accordance with the present invention will hereinafter be described in detail.

Upon application of the supply voltage Vdd, the first PMOS transistor MP1 is turned on to transfer the supply voltage Vdd to the first node N1. As a result, a signal at the first node N1 becomes high in logic, thereby causing the first back bias voltage detection signal Vbbdet1 to go high in logic and the second back bias voltage detection signal Vbbdet2 to go low in logic.

If the back bias voltage Vbb at the back bias voltage node is lowered to about −3 Vt by the operation of the back bias voltage charge pumping circuit 50 after the lapse of a predetermined time period, the first to third NMOS transistors MN1–MN3 are turned on to allow current to flow from the first node N1 to the back bias voltage node. As a result, the signal at the first node N1 becomes low in logic, thereby causing the first back bias voltage detection signal Vbbdet1 to go low in logic and the second back bias voltage detection signal Vbbdet2 to go high in logic.

Figure 3:
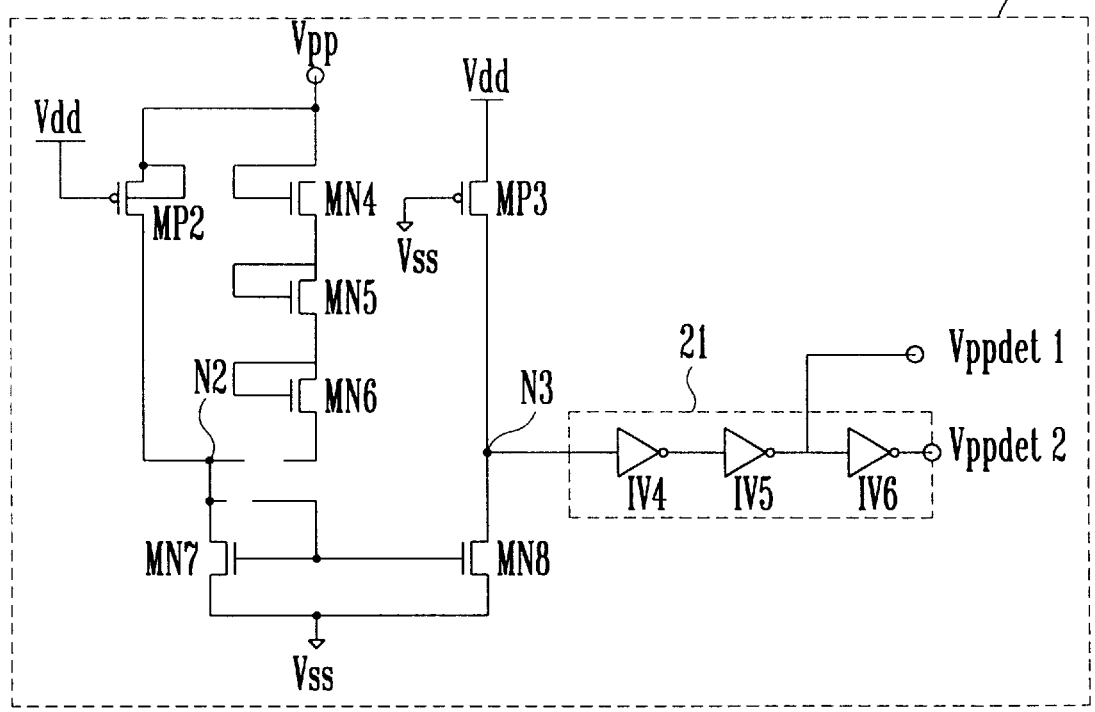
FIG. 3 is a detailed circuit diagram of a high voltage level detector in FIG. 1.

FIG. 3 is a detailed circuit diagram of the high voltage level detector 20 in FIG. 1. As shown in this drawing, the high voltage level detector 20 includes a second PMOS transistor MP2 connected between the high voltage node and a second node N2. The second PMOS transistor MP2 is self-biased and has its gate connected to the supply voltage Vdd. The high voltage level detector 20 further includes fourth to sixth NMOS transistors MN4–MN6 connected in the form of diodes in series between the high voltage node and the second node N2, a seventh NMOS transistor MN7 connected between the second node N2 and the ground voltage Vss, an eighth NMOS transistor MN8 connected between a third node N3 and the ground voltage Vss, and a third PMOS transistor MP3 connected between the supply voltage Vdd and the third node N3. The seventh and eighth NMOS transistors MN7 and MN8 have their gates connected in common to the second node N2, and the third PMOS transistor MP3 has its gate connected to the ground voltage Vss. The high voltage level detector 20 further includes a second buffer 21 connected to the third node N3. The second buffer 21 is provided with fourth and fifth inverters IV4 and IV5 connected in series between the third node N3 and an output terminal of the second buffer 21 for outputting the first high voltage detection signal Vppdet1, and a sixth inverter IV6 connected between the output terminal of the second buffer 21 for outputting the first high voltage detection signal Vppdet1 and an output terminal of the second buffer 21 for outputting the second high voltage detection signal Vppdet2.

The operation of the high voltage level detector 20 with the above-mentioned construction in accordance with the present invention will hereinafter be described in detail.

The second PMOS transistor MP2, which is self-biased and has its gate connected to the supply voltage Vdd, supplies constant current to the second node N2 according to the level of the high voltage Vpp at the high voltage node to prevent the second node N2 from floating. The seventh and eighth NMOS transistors MN7 and MN8 are connected in the form of current mirror.

A voltage level at the third node N3 is determined by the supply voltage Vdd which is one of two inputs to be compared, and a voltage level at the second node N2 is determined by the high voltage Vpp which is the other input. At this time, the voltage level at the second node N2 is Vpp−3 Vt.

In the case where the high voltage Vpp is lower than the supply voltage Vdd, the voltage level at the third node N3 is higher than the voltage level (Vpp−3 Vt) at the second node N2. As a result, a signal at the second node N2 becomes low in logic and a signal at the third node N3 becomes high in logic, thereby causing the first high voltage detection signal Vppdet1 to go high in logic and the second high voltage detection signal Vppdet2 to go low in logic.

To the contrary, in the case where the high voltage Vpp is higher than Vdd+3 Vt, the voltage level at the third node N3 is lower than the voltage level (Vpp−3 Vt) at the second node N2. As a result, the signal at the second node N2 becomes high in logic and the signal at the third node N3 becomes low in logic, thereby causing the first high voltage detection signal Vppdet1 to go low in logic and the second high voltage detection signal Vppdet2 to go high in logic.

Figure 4:
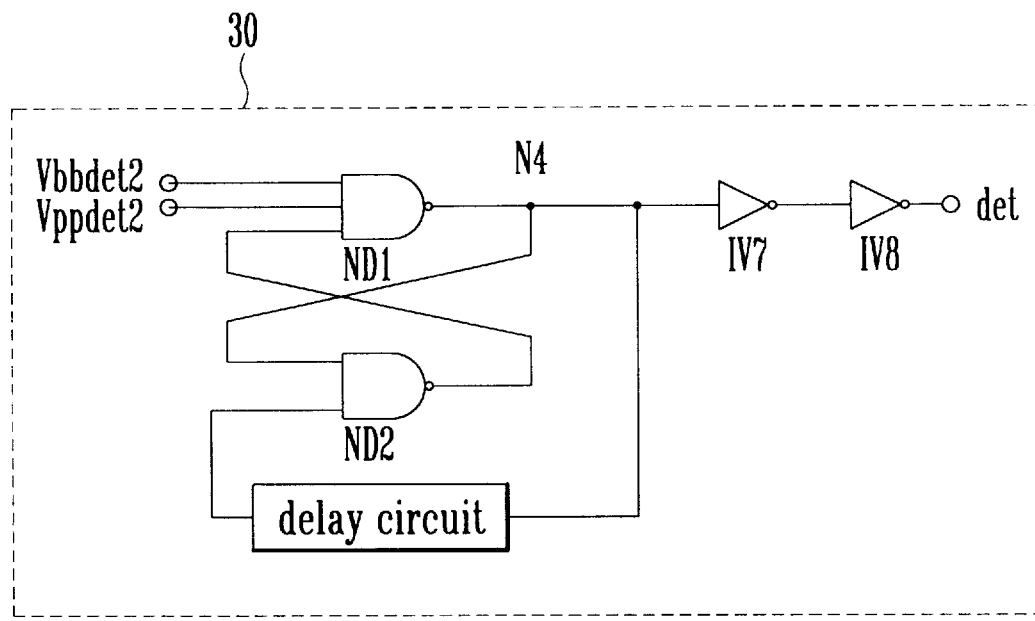
FIG. 4 is a detailed circuit diagram of a control logic circuit in FIG. 1.

FIG. 4 is a detailed circuit diagram of the control logic circuit 30 in FIG. 1. As shown in this drawing, the control logic circuit 30 includes a first NAND gate ND1 for NANDing the second back bias voltage detection signal Vbbdet2 from the back bias voltage level detector 10, the second high voltage detection signal Vppdet2 from the high voltage level detector 20 and an output signal from a second NAND gate ND2 and outputting the NANDed result to a fourth node N4, a delay circuit for delaying a signal at the fourth node N4 for a predetermined time period and outputting the delayed signal to the second NAND gate ND2, and seventh and eighth inverters IV7 and IV8 for delaying the signal at the fourth node N4 for a predetermined time period and outputting the delayed signal as the control signal det to the oscillator 40. The second NAND gate ND2 is adapted to NAND the signal at the fourth node N4 and an output signal from the delay circuit and output the NANDed result to the first NAND gate ND1.

The operation of the control logic circuit 30 with the above-mentioned construction in accordance with the present invention will hereinafter be described in detail.

The first and second NAND gates ND1 and ND2 constitute a latch circuit. The second back bias voltage detection signal Vbbdet2 from the back bias voltage level detector 10 and the second high voltage detection signal Vppdet2 from the high voltage level detector 20 are applied to a set terminal of the latch circuit and then stored therein. The signal at the fourth node N4 and the output signal from the delay circuit are applied to a reset terminal of the latch circuit. This has the effect of improving the stability in multiple level voltage detection. Namely, only initial input data to the set terminal of the latch circuit is stored for the delay time of the delay circuit.

Figure 5:
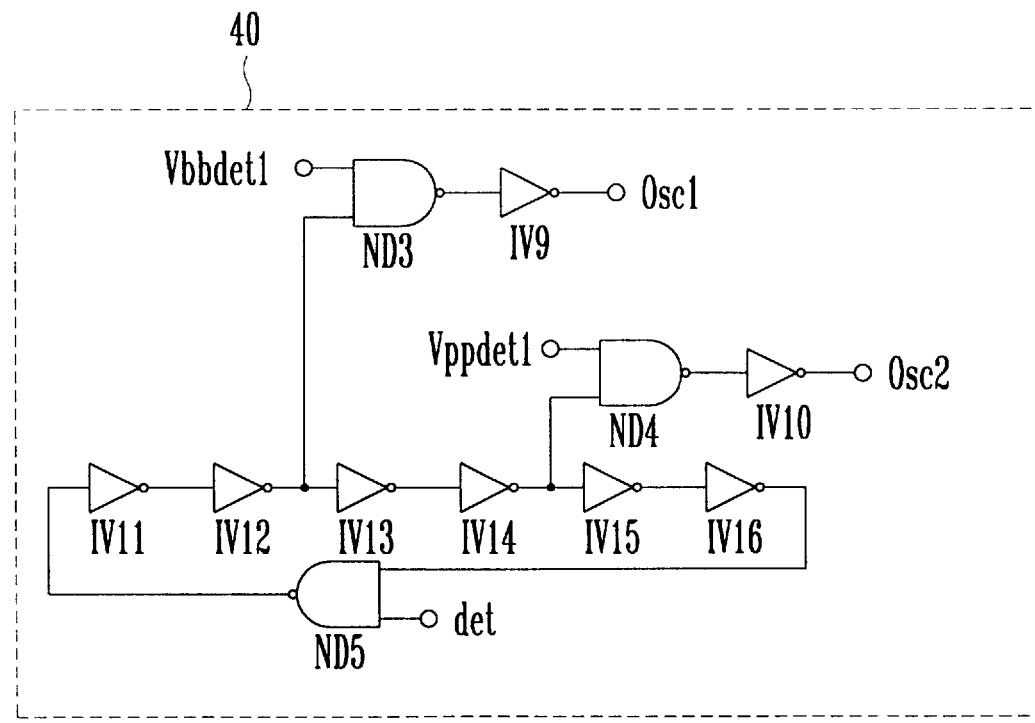
FIG. 5 is a detailed circuit diagram of an oscillator in FIG. 1.

FIG. 5 is a detailed circuit diagram of the oscillator 40 in FIG. 1. As shown in this drawing, the oscillator 40 includes a ring oscillator. The ring oscillator is provided with eleventh to sixteenth inverters IV11–IV16 connected in series, and a fifth NAND gate ND5 for NANDing an output signal from the sixteenth inverter IV16 and the control signal det from the control logic circuit 30 and outputting the NANDed result to the eleventh inverter IV11. The oscillator 40 further includes a third NAND gate ND3 for NANDing the first back bias voltage detection signal Vbbdet1 from the back bias voltage level detector 10 and an output signal from the twelfth inverter IV12, a ninth inverter IV9 for inverting an output signal from the third NAND gate ND3 and supplying the inverted signal as the first output signal Osc1 to the back bias voltage charge pumping circuit 50, a fourth NAND gate ND4 for NANDing the first high voltage detection signal Vppdet1 from the high voltage level detector 20 and an output signal from the fourteenth inverter IV14, and a tenth inverter IV10 for inverting an output signal from the fourth NAND gate ND4 and supplying the inverted signal as the second output signal Osc2 to the high voltage charge pumping circuit 60.

The operation of the oscillator 40 with the above-mentioned construction in accordance with the present invention will hereinafter be described in detail.

Only when the control signal det from the control logic circuit 30 which is one input of the fifth NAND gate ND5 is high in logic, transitions are periodically made at respective nodes of the inverter chain of the ring oscillator. Also, only when the first back bias voltage detection signal Vbbdet1 from the back bias voltage level detector 10 is high in logic, a pulse from the inverter chain of the ring oscillator is outputted through the first oscillator output terminal. Further, only when the first high voltage detection signal Vppdet1 from the high voltage level detector 20 is high in logic, another pulse from the inverter chain of the ring oscillator is outputted through the second oscillator output terminal.

Figure 6:
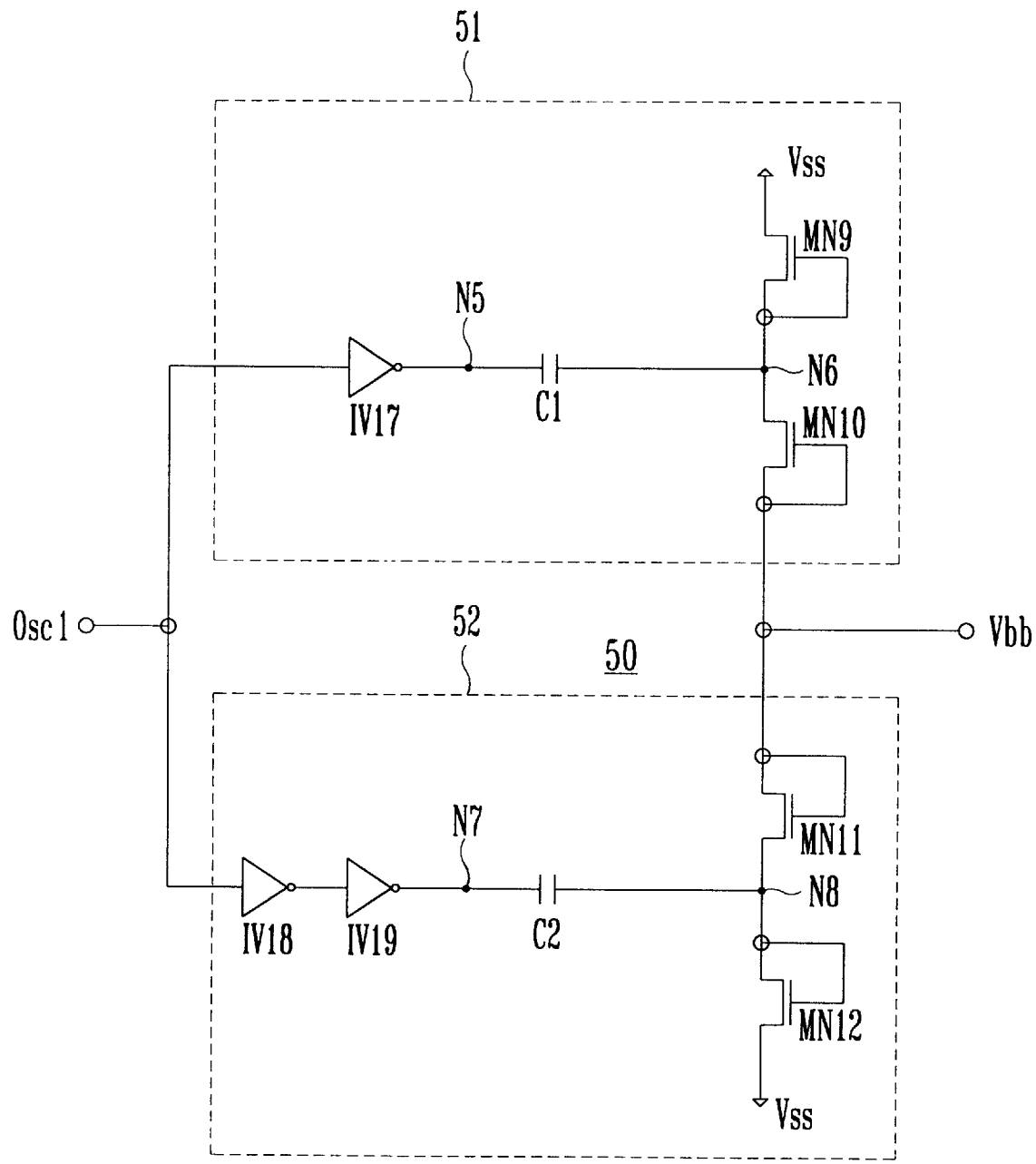
FIG. 6 is a detailed circuit diagram of a back bias voltage charge pumping circuit in FIG. 1.

FIG. 6 is a detailed circuit diagram of the back bias voltage charge pumping circuit 50 in FIG. 1. As shown in this drawing, the back bias voltage charge pumping circuit 50 includes a first back bias voltage charge pump 51 for pumping charge to the back bias voltage node when the first oscillator output signal Osc1 goes from low to high in logic, and a second back bias voltage charge pump 52 for pumping charge to the back bias voltage node when the first oscillator output signal Osc1 goes from high to low in logic.

The first back bias voltage charge pump 51 includes a seventeenth inverter IV17 connected between the first oscillator output terminal and a fifth node N5, a first capacitor C1 connected between the fifth node N5 and a sixth node N6, a ninth NMOS transistor MN9 connected between the sixth node N6 and the ground voltage Vss, and a tenth NMOS transistor MN10 connected between the sixth node N6 and the back bias voltage node. The ninth NMOS transistor MN9 has its gate connected to the sixth node N6, and the tenth NMOS transistor MN10 has its gate connected to the back bias voltage node.

The second back bias voltage charge pump 52 includes eighteenth and nineteenth inverters IV18 and IV19 connected in series between the first oscillator output terminal and a seventh node N7, a second capacitor C2 connected between the seventh node N7 and an eighth node N8, an eleventh NMOS transistor MN11 connected between the back bias voltage node and the eighth node N8, and a twelfth NMOS transistor MN12 connected between the eighth node N8 and the ground voltage Vss. The eleventh NMOS transistor MN11 has its gate connected to the back bias voltage node, and the twelfth NMOS transistor MN12 has its gate connected to the eighth node N8.

The operation of the back bias voltage charge pumping circuit 50 with the above-mentioned construction in accordance with the present invention will hereinafter be described in detail.

The use of two charge pumps as mentioned above is for increasing charge pumping efficiency. The first and second back bias voltage charge pumps 51 and 52 are the same in operation, only with the exception that the first oscillator output signal Osc1 has the opposite phases. Hence, only the operation of the first back bias voltage charge pump 51 will be mentioned.

Upon application of the supply voltage Vdd, a signal at the sixth node N6 is low in logic, the voltage level of which is determined by the ninth NMOS transistor MN9. Because the back bias voltage Vbb at the back bias voltage node is low in logic, the tenth NMOS transistor MN10 is turned off. If the first oscillator output signal Osc1, which is at a standby state, is low in logic, a voltage of about Vdd will be induced across the first capacitor C1 because the signal at the sixth node N6 is low in logic.

Then, when the first oscillator output signal Osc1 goes from low to high in logic, it is inverted into low in logic by the seventeenth inverter IV17 and applied to the first capacitor C1.

Subsequently, the signal at the sixth node N6 is reduced to about −Vdd, thereby causing the ninth NMOS transistor MN9 to be turned off and the tenth NMOS transistor MN10 to be turned on. As a result, because charge is shared between the sixth node N6 and the back bias voltage node, the back bias voltage Vbb is reduced to a negative voltage level, resulting in completion of the charge pumping operation.

On the other hand, the first oscillator output signal Osc1 of high logic is inverted into low in logic by the eighteenth inverter IV18 and again into high in logic by the nineteenth inverter IV19 and then applied to the second capacitor C2.

Subsequently, a signal at the eighth node N8 remains at its low logic state, thereby causing the eleventh NMOS transistor MN11 to be turned off. As a result, the charge pumping operation is not performed by the second back bias voltage charge pump 52.

If the back bias voltage Vbb at the back bias voltage node has a desired negative voltage level after the lapse of a predetermined time period, no further pulse will be generated at the first oscillator output terminal. Then, when the amount of charge from a general circuit is increased, the first oscillator output signal Osc1 is again generated to start the charge pumping operation.

Figure 7:
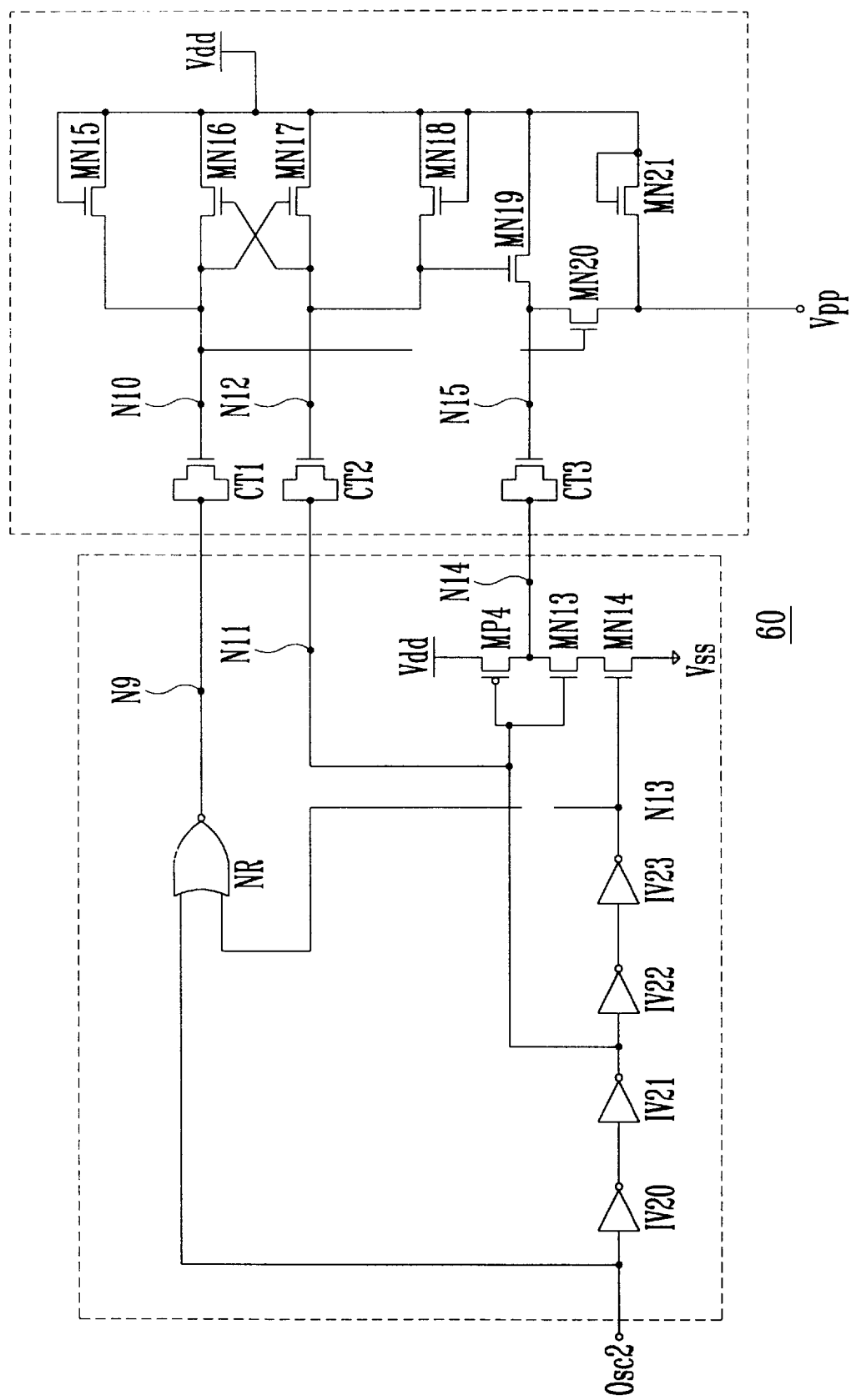
FIG. 7 is a detailed circuit diagram of a high voltage charge pumping circuit in FIG. 1.

FIG. 7 is a detailed circuit diagram of the high voltage charge pumping circuit 60 in FIG. 1. As shown in this drawing, the high voltage charge pumping circuit 60 includes a NOR gate NR for NORing the second oscillator output signal Osc2 and a signal at a thirteenth node N13 and outputting the NORed result to a ninth node N9, twentieth and twenty-first inverters IV20 and IV21 connected in series between the second oscillator output terminal and an eleventh node N11, twenty-second and twenty-third inverters IV22 and IV23 connected in series between the eleventh node Nil and the thirteenth node N13, a first capacitive transistor CT1 connected between the ninth node N9 and a tenth node N10, a second capacitive transistor CT2 connected between the eleventh node N11 and a twelfth node N12, a fourth PMOS transistor MP4 connected between the supply voltage Vdd and a fourteenth node N14, and thirteenth and fourteenth NMOS transistors MN13 and MN14 connected in series between the fourteenth node N14 and the ground voltage Vss. The fourth PMOS transistor MP4 and thirteenth NMOS transistor MN13 have their gates connected in common to the eleventh node N11, and the fourteenth NMOS transistor MN14 has its gate connected to the thirteenth node N13.

The high voltage charge pumping circuit 60 further includes a third capacitive transistor CT3 connected between the fourteenth node N14 and a fifteenth node N15, a fifteenth NMOS transistor MN15 connected between the tenth node N10 and the supply voltage Vdd, a sixteenth NMOS transistor MN16 connected between the tenth node N10 and the supply voltage Vdd, a seventeenth NMOS transistor MN17 connected between the twelfth node N12 and the supply voltage Vdd, an eighteenth NMOS transistor MN18 connected between the twelfth node N12 and the supply voltage Vdd, a nineteenth NMOS transistor MN19 connected between the fifteenth node N15 and the supply voltage Vdd, a twentieth NMOS transistor MN20 connected between the fifteenth node N15 and the high voltage node, and a twenty-first NMOS transistor MN21 connected between the high voltage node and the supply voltage Vdd. The fifteenth, eighteenth and twenty-first NMOS transistors MN15, MN18 and MN21 have their gates connected in common to the supply voltage Vdd. The sixteenth and nineteenth NMOS transistors MN16 and MN19 have their gates connected in common to the twelfth node N12. The seventeenth and twentieth NMOS transistors MN17 and MN20 have their gates connected in common to the tenth node N10.

The operation of the high voltage charge pumping circuit 60 with the above-mentioned construction in accordance with the present invention will hereinafter be described in detail with reference to FIGS. 8a to 8h.

Figure 8:
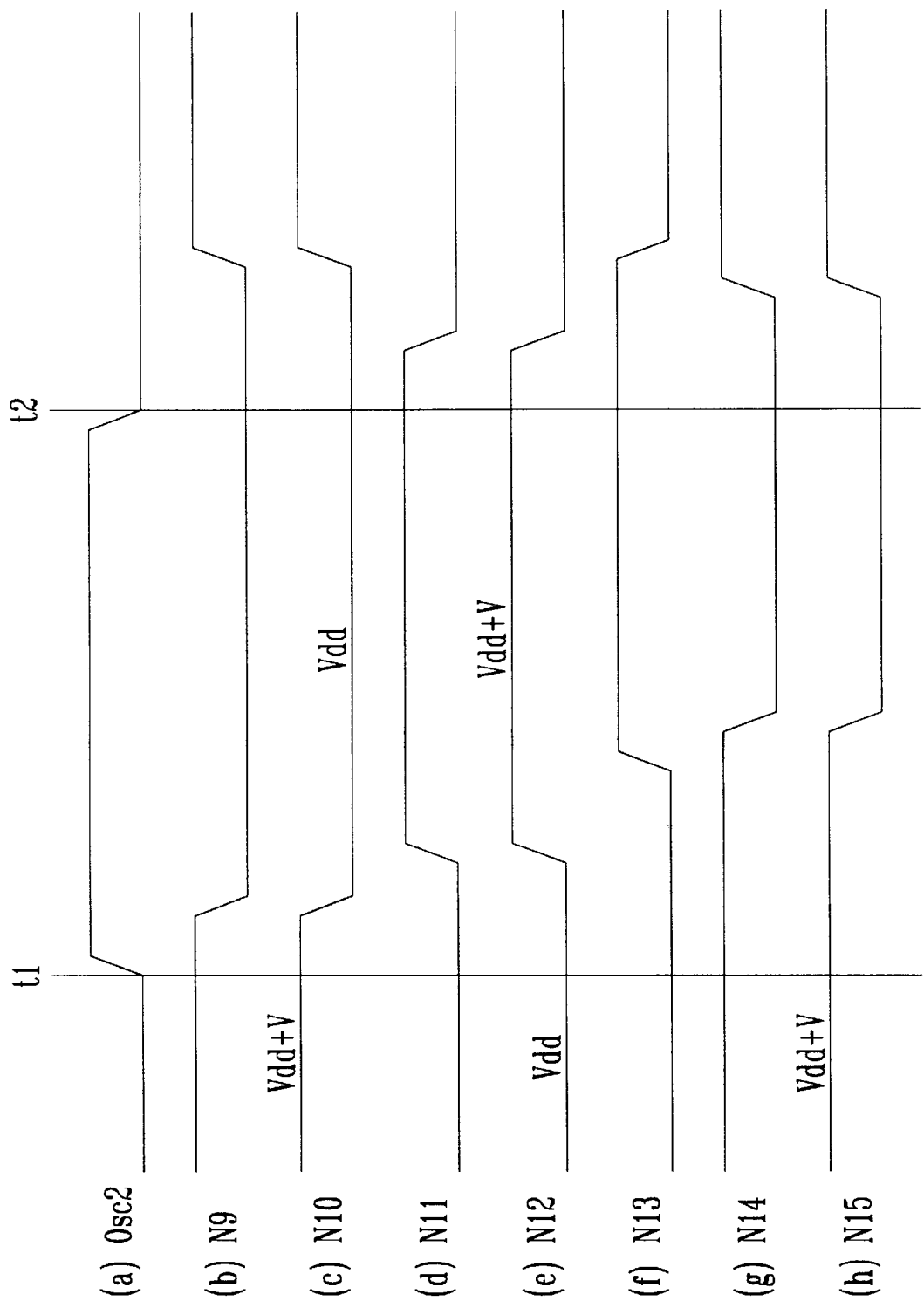
FIGS. 8a to 8h are timing diagrams illustrating the operation of the high voltage charge pumping circuit in FIG. 7.

FIGS. 8a to 8h are timing diagrams illustrating the operation of the high voltage charge pumping circuit 60 in FIG. 7. In a precharge mode, at time t1, the second oscillator output signal Osc2 goes from low to high in logic as shown in FIG. 8a and the signal at the thirteenth node N13 is low in logic as shown in FIG. 8f. As a result, the output of the NOR gate NR makes a high to low logic transition as shown in FIG. 8b.

Subsequently, a signal at the tenth node N10 is lowered from 2 Vdd−Vt (referred to hereinafter as Vdd+V) to Vdd by a charge pumping operation of the first capacitive transistor CT1. As a result, the signal at the tenth node N10 becomes low in logic. At this time, the fourteenth NMOS transistor MN14 remains at its off state.

Also, the second oscillator output signal Osc2 of high logic is applied to the eleventh node N11 through the twentieth and twenty-first inverters IV20 and IV21. As a result, a signal at the eleventh node N11 goes from low to high in logic as shown in FIG. 8d. Then, the high logic signal at the eleventh node N11 is applied to the second capacitive transistor CT2.

A signal at the twelfth node N12 is boosted from Vdd to Vdd+V by a charge pumping operation of the second capacitive transistor CT2, as shown in FIG. 8e. Then, the boosted signal at the twelfth node N12 is applied to the gate of the nineteenth NMOS transistor MN19 to turn it on. Also, the high logic signal at the eleventh node N11 is applied to the gates of the fourth PMOS transistor MP4 and thirteenth NMOS transistor MN13. As a result, the fourth PMOS transistor MP4 is turned off and the thirteenth NMOS transistor MN13 is turned on. Further, the high logic signal at the eleventh node N11 is delayed through the twenty-second and twenty-third inverters IV22 and IV23 and then transferred to the thirteenth node N13. As a result, the signal at the thirteenth node N13 goes from low to high in logic as shown in FIG. 8f. Then, the high logic signal at the thirteenth node N13 is applied to the gate of the fourteenth NMOS transistor MN14 to turn it on.

Subsequently, a signal at the fourteenth node N14 goes from high to low in logic as shown in FIG. 8g, and a signal at the fifteenth node N15 is lowered from Vdd+V to Vdd as shown in FIG. 8h. In result, the high voltage Vpp of the previous cycle is maintained at the high voltage node.

In the case where charge is pumped to the high voltage node at which the high voltage Vpp of the previous cycle is maintained, at time t2, the second oscillator output signal Osc2 goes from high to low in logic as shown in FIG. 8a. The second oscillator output signal Osc2 of low logic is applied to the eleventh node N11 through the twentieth and twenty-first inverters IV20 and IV21. As a result, the signal at the eleventh node N11 goes from high to low in logic as shown in FIG. 8d. Then, the low logic signal at the eleventh node N11 is applied to the second capacitive transistor CT2.

The signal at the twelfth node N12 is lowered from Vdd+V to Vdd as shown in FIG. 8e, thereby causing the nineteenth NMOS transistor MN19 to be turned off. Also, the low logic signal at the eleventh node N11 is applied to the gates of the fourth PMOS transistor MP4 and thirteenth NMOS transistor MN13.

Further, the low logic signal at the eleventh node N11 is transferred to the thirteenth node N13 through the twenty-second and twenty-third inverters IV22 and IV23. As a result, the signal at the thirteenth node N13 goes from high to low in logic as shown in FIG. 8f. Then, the low logic signal at the thirteenth node N13 is applied to the gate of the fourteenth NMOS transistor MN14.

As a result, the thirteenth and fourteenth NMOS transistors MN13 and MN14 are turned off and the fourth PMOS transistor MP4 is turned on.

Subsequently, the signal at the fourteenth node N14 goes from low to high in logic as shown in FIG. 8g, and the signal at the fifteenth node N15 is boosted from Vdd to Vdd+V by a charge pumping operation of the third capacitive transistor CT3, as shown in FIG. 8h.

On the other hand, because the second oscillator output signal Osc2 is low in logic as shown in FIG. 8a and the signal at the thirteenth node N13 is low in logic as shown in FIG. 8f, the signal at the ninth node N9, or the output of the NOR gate NR, goes from low to high in logic as shown in FIG. 8b.

Then, the signal at the tenth node N10 is boosted from Vdd to Vdd+V by the charge pumping operation of the first capacitive transistor CT1. As a result, the signal at the tenth node N10 becomes high in logic, thereby causing the twentieth NMOS transistor MN20 to be turned on.

In result, because charge is shared between the fifteenth node N15 and the high voltage node, the high voltage Vpp is boosted.

At that time the high voltage Vpp is boosted to a sufficient level after the lapse of a predetermined time period, the second oscillator output signal Osc2 is not generated and the high voltage charge pumping circuit 60 is thus turned off. Thereafter, if the amount of charge is reduced at the high voltage node, the second oscillator output signal Osc2 will be generated to drive the high voltage charge pumping circuit 60, so as to pump charge to the high voltage node.

As apparent from the above description, according to the present invention, the single ring oscillator is provided in the multiple level voltage generator for the semiconductor memory device. Therefore, the present invention has the effect of reducing power consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multiple level voltage generator for a semiconductor memory device, comprising:

back bias voltage charge pumping means for pumping charge to a back bias voltage node;

back bias voltage level detection means for detecting the level of a back bias voltage at said back bias voltage node and generating first and second back bias voltage detection signals in accordance with the detected result, said first and second back bias voltage detection signals being the same in amplitude and opposite in phase;

high voltage charge pumping means for pumping charge to a high voltage node;

high voltage level detection means for detecting the level of a high voltage at said high voltage node and generating first and second high voltage detection signals in accordance with the detected result, said first and second high voltage detection signals being the same in amplitude and opposite in phase;

control means for generating a control signal in response to said second back bias voltage detection signal from said back bias voltage level detection means and said second high voltage detection signal from said high voltage level detection means; and oscillation means for generating first and second output signals in response to said control signal from said control means, said first back bias voltage detection signal from said back bias voltage level detection means and said first high voltage detection signal from said high voltage level detection means and applying the generated first and second output signals to said back bias voltage charge pumping means and said high voltage charge pumping means, respectively.

2. A multiple level voltage generator for a semiconductor memory device, as set forth in claim 1, wherein said back bias voltage charge pumping means includes:

a first back bias voltage charge pump for pumping charge to said back bias voltage node when said first output signal from said oscillation means goes from low to high in logic; and a second back bias voltage charge pump for pumping charge to said back bias voltage node when said first output signal from said oscillation means goes from high to low in logic;

whereby a charge pumping efficiency is increased.

3. A multiple level voltage generator for a semiconductor memory device, as set forth in claim 2, wherein said first back bias voltage charge pump includes:

an inverter for inverting said first output signal from said oscillation means;

a capacitor having its one side connected to an output terminal of said inverter;

a first MOS transistor connected in the form of diode between the other side of said capacitor and said back bias voltage node; and a second MOS transistor connected in the form of diode between the other side of said capacitor and a ground voltage source.

4. A multiple level voltage generator for a semiconductor memory device, as set forth in claim 2, wherein said second back bias voltage charge pump includes:

first and second inverters for delaying said first output signal from said oscillation means;

a capacitor having its one side connected to an output terminal of said second inverter;

a first MOS transistor connected in the form of diode between the other side of said capacitor and said back bias voltage node; and a second MOS transistor connected in the form of diode between the other side of said capacitor and a ground voltage source.

5. A multiple level voltage generator for a semiconductor memory device, as set forth in claim 1, wherein said back bias voltage level detection means includes:

a PMOS transistor having its gate connected to a ground voltage source and its source connected to a supply voltage source;

a plurality of NMOS transistors connected in the form of diodes in series between a drain of said PMOS transistor and said back bias voltage node; and buffering means connected to a coupling node of said PMOS transistor and said NMOS transistors, said buffering means including a plurality of inverters for generating said first and second back bias voltage detection signals.

6. A multiple level voltage generator for a semiconductor memory device, as set forth in claim 1, wherein said high voltage level detection means includes:

a first PMOS transistor connected between said high voltage node and a first node, said first PMOS transistor having its gate connected to a supply voltage source;

first to third NMOS transistors connected in the form of diodes in series between said high voltage node and said first node, said first to third NMOS transistors being turned on when said high voltage level at said high voltage node is higher by 3 Vt(threshold voltage) or more than a voltage level at said first node, to make a signal at said first node high in logic;

a fourth NMOS transistor connected between said first node and a ground voltage source, said fourth NMOS transistor having its gate and drain connected in common to said first node;

a fifth NMOS transistor having its gate connected to said first node, its drain connected to a second node and its source connected to said ground voltage source;

a second PMOS transistor connected between said supply voltage source and said second node, said second PMOS transistor having its gate connected to said ground voltage source; and first to third inverters connected in series to said second node, for buffering a signal at said second node to generate said first and second high voltage detection signals.

7. A multiple level voltage generator for a semiconductor memory device, as set forth in claim 1, wherein said control means includes:

latch means including first and second NANTD gates cross coupled to each other, said first NAND gate NANDing said second back bias voltage detection signal from said back bias voltage level detection means, said second high voltage detection signal from said high voltage level detection means and an output signal from said second NAND gate, said second NAND gate having its one input terminal for inputting an output signal from said first NAND gate;

delay means for delaying the output signal from said first NAND gate and outputting the delayed signal to the other input terminal of said second NAND gate; and buffering means for buffering the output signal from said first NAND gate and outputting the buffered signal as the control signal to said oscillation means.

8. A multiple level voltage generator for a semiconductor memory device, as set forth in claim 1, wherein said oscillation means includes:

a ring oscillator including an inverter chain, said inverter chain having first and second nodes for periodically generating signals only when said control signal from said control means is made active;

first NAND means for generating said first output signal in response to said signal at said first node of said ring oscillator and said first back bias voltage detection signal from said back bias voltage level detection means; and second NAND means for generating said second output signal in response to said signal at said second node of said ring oscillator and said first high voltage detection signal from said high voltage level detection means.

* * * * *